(12) United States Patent
Torazawa

(10) Patent No.: US 6,522,514 B1
(45) Date of Patent: Feb. 18, 2003

(54) PHOTOCOUPLER AND CONNECTING SYSTEM USING THE SAME

(75) Inventor: Hiroyasu Torazawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/538,295

(22) Filed: Mar. 30, 2000

(30) Foreign Application Priority Data

Jul. 23, 1999 (JP) .......................................... 11-209703

(51) Int. Cl.7 ............................................... H02H 3/00
(52) U.S. Cl. ...................... 361/93.1; 361/103; 361/104
(58) Field of Search ........................ 250/551; 327/525, 327/514; 361/93.1, 93.8, 93.9, 91.4, 88, 103, 104

(56) References Cited

U.S. PATENT DOCUMENTS 5,408,102 A * 4/1995 Okumura .................... 250/551
5,757,020 A * 5/1998 Torazawa et al. ........... 250/551
6,198,337 B1 * 3/2001 Matsuura .................... 327/525

* cited by examiner

Primary Examiner—Stephen W. Jackson
(74) Attorney, Agent, or Firm—Wenderoth, Lind & Ponack, L.L.P.

(57) ABSTRACT

A photocoupler (100) includes a light emitting unit (120) which emits an input light (P); a first path (114) connecting a first terminal (110) and a second terminal (112); a switching circuit (150) provided in the first path (114) to open and close the first path (114) in response to the input light (P); and a circuit breaker (130, 140) provided in the first path (114) to disconnect the first path (114) in response to over current (excess current).

21 Claims, 10 Drawing Sheets

(a)

(b)

(a)

(b)

(a)

(b)

PHOTOCOUPLER AND CONNECTING SYSTEM USING THE SAME

CROSS REFERENCE TO RELATED APPLICATION

This application claims the priority of Application No. H11-209703, filed Jul. 23, 1999 in Japan, the subject matter of which is incorporated herein by reference.

TECHNICAL FIELD OF THE INVENTION

The present invention relates to photocouplers and connecting systems using photocouplers, such as power supply system, terminal switching system, etc.

BACKGROUND OF THE INVENTION

A photocoupler may be provided in a connecting line to open and close the line selectively. Photocouplers have been used for a variety of switching systems, such as a switching device provided between power supply and electric device, a switching device for switching communication terminals to be connected to a communication line, and to a telephone switchboard. In general, a photocoupler includes an output unit provided with a power device, which controls switching operation of connecting lines. Such a power device may be a MOSFET, photodiode, phototransistor, photo-Darlington, photo-thyristor or the like.

According to a conventional photocoupler, the power device in the output unit becomes equivalent to a resistance in circuit when the connecting lines are closed. The value of the resistance increases in response to Joule heat resulting form an electric current flowing through the resistance. Therefore, a large amount of load is applied to the power device when a large amount of current flows through the connecting lines. If over current (excess current), which is the current exceeds a rated value (surge current withstand) of the power device, flows through the connecting lines, the power device would be damaged, and in many cases, a short circuit is made. As a result, the electric current keeps flowing through the connecting lines.

As described above, when the photocoupler breaks down or be damaged while the connecting lines are still closed (connected), the whole system connected with the photocoupler may be damaged as well.

OBJECTS OF THE INVENTION

Accordingly, an object of the present invention is to provide a photocoupler which keeps being opened when a power device is damaged in response to over current (excess current).

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a photocoupler includes a light emitting unit which emits input light; a first path connecting a first terminal and a second terminal; a switching circuit provided in the first path to open and close the first path in response to the input light; and a circuit breaker provided in the first path to disconnect the first path in response to over current (excess current). When an over current (excess current) is supplied to the first path, the photocoupler becomes out of order under a condition that the first path keeps being opened (disconnected).

The switching circuit may include a photo detector, which generates an electric signal in response to the input light; and a switching element which opens and closes the first path in response to the electric signal, supplied from the photo detector.

The circuit breaker may be provided between two of the switching elements. When more than three switching elements are used, the circuit breaker would be arranged between two of them. A back-up (extra) terminal can be provided between adjacent two switching elements so that the back-up terminal is used instead of the first or second terminal when one of the switching elements disconnects the first path.

The switching element may be a MOSFET (Metal Oxide Semiconductor Field Effect Transistor) so that a MOS output type of photocoupler is made. Further, the circuit breaker and photo detector may be fabricated to be in a single chip apart from the switching element.

The switching circuit may include a discharge controller provided in a second path, connecting the photo detector and switching element, to control the discharge condition of the switching element. The discharge controller may be designed to discharge electric charge accumulated in the switching element so that the response speed of the switching element is improved.

The discharge controller may be driven in response to the input light. The discharge controller can be driven concurrently with the photo detector. As a result, discharge controlling operation of the switching element can be carried out automatically.

The switching element may be a semiconductor element that is one selected from a group composed of photodiode, phototransistor, photo-Darlington and photo-thyristor. The circuit breaker, photo detector and discharge controller may be fabricated to be in a single chip apart from the switching element.

The circuit breaker may include a section that is melted and cut off in response to over current (excess current) so that the first path is disconnected reliably.

The circuit breaker may include plurality fuses which are melted and cut off in response to over current (excess current) flowing through the first path. The fuses may be connected in parallel in the first path. According to this aspect of the invention, the fuses are not cut off all together but cut off one by one, so that load applied to the switching circuit when the first path is disconnected is decreased.

The fuses may include a first fuse and a second fuse, in which the second fuse has a smaller cross-section area than the first fuse. The first and second fuses are connected in series. Joule heat is generated more at the second fuse, so that the first path is disconnected reliably.

The section included in the circuit breaker may be made of an aluminum wire so that resistance value of the first path can be prevented from being increased.

The photocoupler may include plural circuit breakers provided in series in the first path. A back-up (extra) terminal can be provided between adjacent two circuit breakers so that the back-up terminal is used instead of the first or second terminal when one of the circuit breakers disconnects the first path.

DETAILED DISCLOSURE OF THE INVENTION

Figure 1:
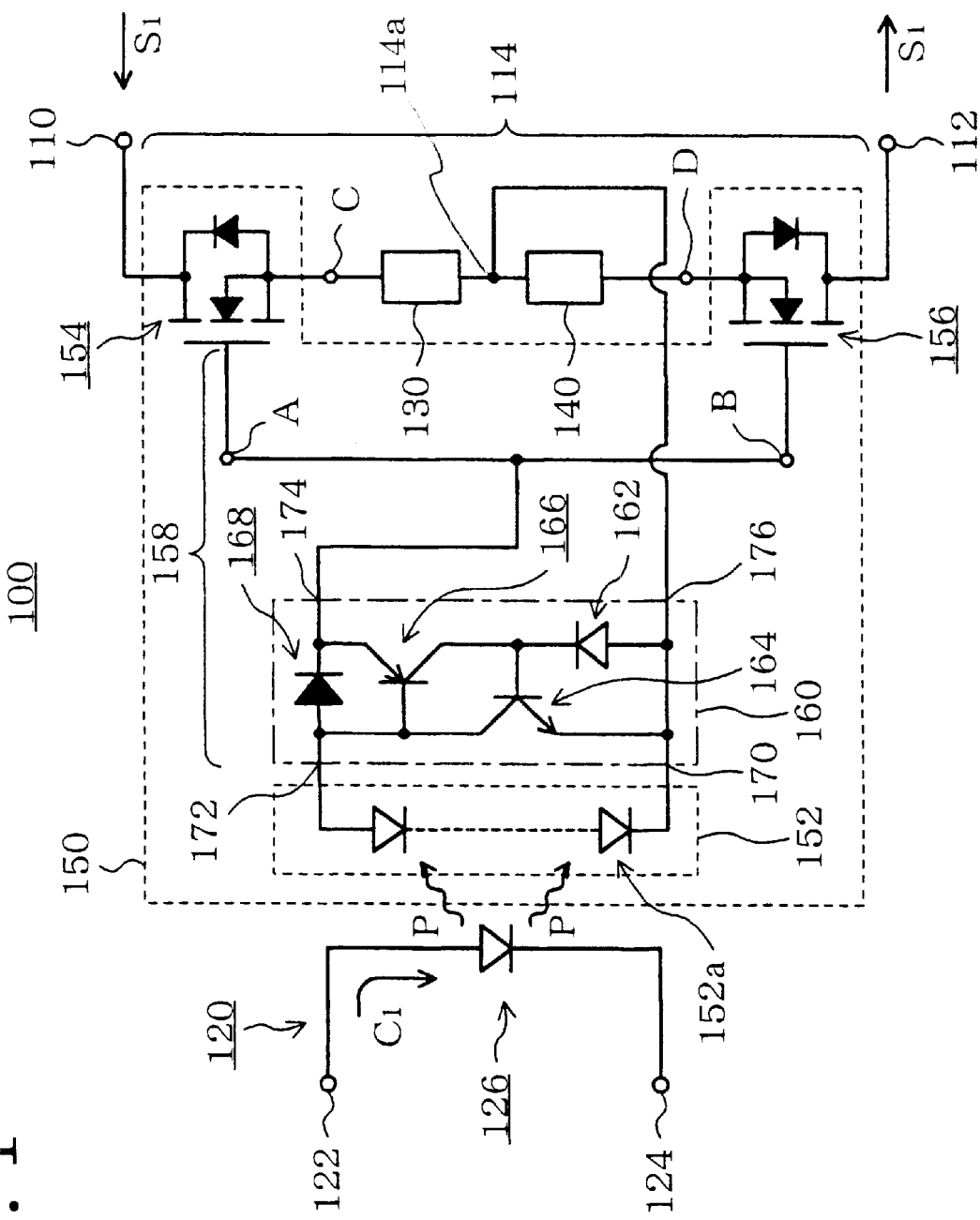
FIG. 1 is an equivalent circuit of a photocoupler according to the present invention.

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Now preferred embodiments of the present invention are described in conjunction with appended drawings. In the drawings, the same or corresponding elements are represented by the same reference numerals, and the same description is not repeated.

FIG. 1 shows an equivalent circuit of a photocoupler 100 according to the present invention. The photocoupler 100 is of a MOS output type. The photocoupler 100 includes a first terminal 110; a second terminal 112; a light emitting unit 120 which can be called an input unit; first and second fuses 130 and 140, which form a circuit breaker; and a switching circuit 150. The first and second fuses 130 and 140 and switching circuit 150 are connected in/on a first path (connecting path) 114, which connects first terminal 110 and second terminal 112. The light-emitting unit 120 is provided electrically apart from the first path 114.

Next, each element of the photocoupler 100 will be described. The light-emitting unit 120 includes first and second input terminals 122 and 124 and a light emitting diode (LED) 126. The light-emitting diode 126 is connected at an anode terminal to the first input terminal 122 and at a cathode terminal to the second input terminal 124. When an electrical current supplied from the first input terminal 122 toward the second input terminal 124, the light-emitting diode 126 emits light "P".

The switching circuit 150 includes a light receiver 152, first and second MOSFETs 154 and 156 and a discharge control circuit 160. The discharge control circuit 160 is arranged in/on a second path 158, which connects the light receiver 152 with the first and second MOSFETs 154 and 156.

The light receiver 152 includes a photodiode array in which a large number of photodiodes 152a is connected in series. The light receiver 152 converts the light P into an electric power. The light receiver 152 is positioned so as to receive the light P, emitted by the light-emitting diode 126, reliably. The light receiver 152 is, for example, arranged so that the photodiodes 152a face (oppose to) the light-emitting diode 126. The light receiver 152, for example, may include more than 10 photodiodes therein.

The first and second MOSFETs 154 and 156 are connected in series in (on) the first path 114. The MOSFET 154 is connected at a drain terminal to the first terminal 110 and at a source terminal to a source terminal of the second MOSFET 156. The second MOSFET 156 is connected at a drain terminal to the second terminal 112.

The discharge control circuit 160 includes a photodiode 162, an NPN type transistor 164, a PNP type transistor 166 and a diode 168. The photodiode 162 is positioned so as to receive the light P, emitted by the light-emitting diode 126, reliably. For example, a detecting area of the photodiode 162 faces (oppose to) an emitting area of the light-emitting diode 126. The discharge control circuit 160 further includes a first input terminal 170, connected to a cathode terminal of the light receiver 152; a first output terminal 174, connected to gate terminals of the first and second MOSFETs 154 and 156; and a second output terminal 176 connected to a node 114a in the first path 114.

In the discharge control circuit 160, an anode terminal of the photodiode 162 and an emitter terminal of the NPN type transistor 164 are connected to the first input terminal 170 and first output terminal 174. The second input terminal 172 is connected with a collector terminal of the NPN type transistor 164, base terminal of the PNP type transistor 166 and anode terminal of the diode 168. The second output terminal 174 is connected to an emitter terminal of the PNP type transistor 166 and cathode terminal of the diode 168.

The discharge control circuit 160 controls discharge condition of the first and second MOSFETs 154 and 156. The discharge control circuit 160 operates as follows in response to the input light P, emitted by the light-emitting diode 126:

When the light-emitting diode 126 emits the input light P, the photodiode 162 receives the light P and potential difference is made between the anode terminal and cathode terminal of the photodiode 162. In response to such potential difference, a reverse bias is made between the base and emitter of the NPN type transistor 164, so that the NPN type transistor 164 turns off. A path connecting the first input terminal 170 and first output terminal 176 and a path connecting the second input terminal 172 and second output terminal 174 are electrically separated in circuit, so that the discharge control circuit 160 gets in a high-impedance condition.

As a result, a voltage generated at the anode terminal of the light receiver 152 is supplied to the gate terminals of the first and second MOSFETs 154 and 156 via the second input terminal 172 and second output terminal 174. On the other hand, a voltage generated at the cathode terminal of the light receiver 152 is supplied to the source terminals of the first and second MOSFETs 154 and 156 via the first input terminal 170 and first output terminal 176. Therefore, the first and second MOSFETs 154 and 156 turn on, and the first path 114 is closed or connected.

When the light-emitting diode 126 emits no light, no potential difference is made between the anode and cathode of the photodiode 162. Therefore, reverse bias is not made between the base and emitter of the NPN type transistor 164. Electric charge accumulated between the gate and source of the first MOSFET 154 and between the gate and source of the second MOSFET 156 is discharged via the second output terminal 174, PNP type transistor 166, NPN type transistor 164 and first output terminal 176. As a result, the first and second MOSFETs 154 and 156 turn off immediately, so that the first path 114 is opened or disconnected.

The first fuse 130 is connected between the node 114a in the first path 114 and the source terminal of the first MOSFET 154. The second fuse 140 is connected between the node 114a in the first path 114 and the source terminal of the second MOSFET 156. When over current (excess current) flows through the fuses 130 and 140, the fuses 130 and 140 are melted and cut off to disconnect the first path 114. A current value that melts and cut off the fuses 130 and 140 is determined low enough so that the current does not damage the first and second MOSFETs 154 and 156.

Next, the operation of the photocoupler 100 is described in conjunction with FIG. 1.

When an input current C1 is supplied to the light-emitting unit 120, the light-emitting diode 126 emits the input light P. In response to the light P, the light receiver 152 generates photoelectromotive force and the discharge control circuit 160 becomes in a high-impedance condition, so that the first and second MOSFETs 154 and 156 turn on. When the first and second MOSFETs 154 and 156 turn on, the first path 114 between the first and second terminals 110 and 112 is closed, and the photocoupler 100 turns on. When the photocoupler 100 turns on, a load current can be supplied and flow between the first and second terminals 110 and 112 in both directions.

If a surge current S1 is supplied to the first terminal 110 while the photocoupler 100 is on, the surge current S1 is supplied to the second terminal 112 via the first MOSFET 154, first fuse 130, node 114a, second fuse 140 and second MOSFET 156; and then the surge current S1 is outputted from the second terminal 112. The surge current S1 could damage the first and second MOSFETs 154 and 156, and first and second fuses 130 and 140.

According to the photocoupler 100, the first and second fuses 130 and 140 disconnect the first path 114 before the first and second MOSFETs 154 and 156 are damaged and broken. As described above, when over current (excess current) flows through the first path 114, the photocoupler 110 becomes out of order before the first and second MOSFETs 154 and 156 are damaged and broken.

Now, preferred embodiments of the present invention will be described.

First Preferred Embodiment

Figure 2:
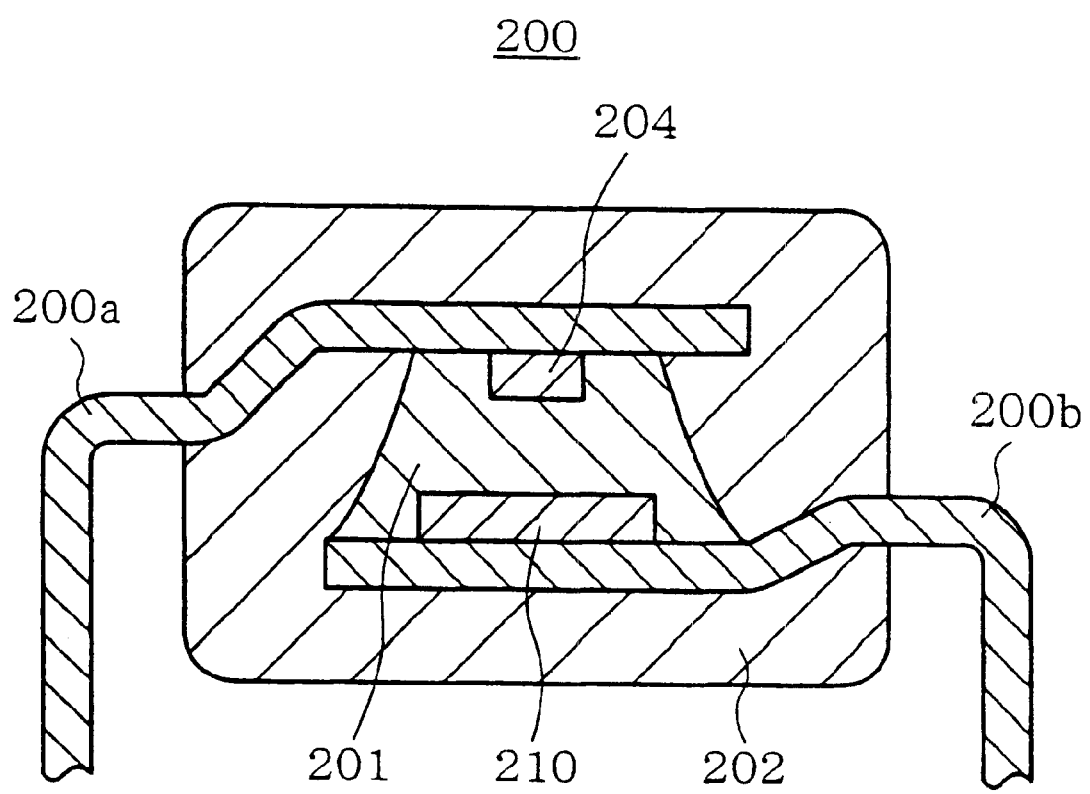
FIG. 2 is a cross-sectional view showing a photocoupler according to the present invention.
Figure 3:
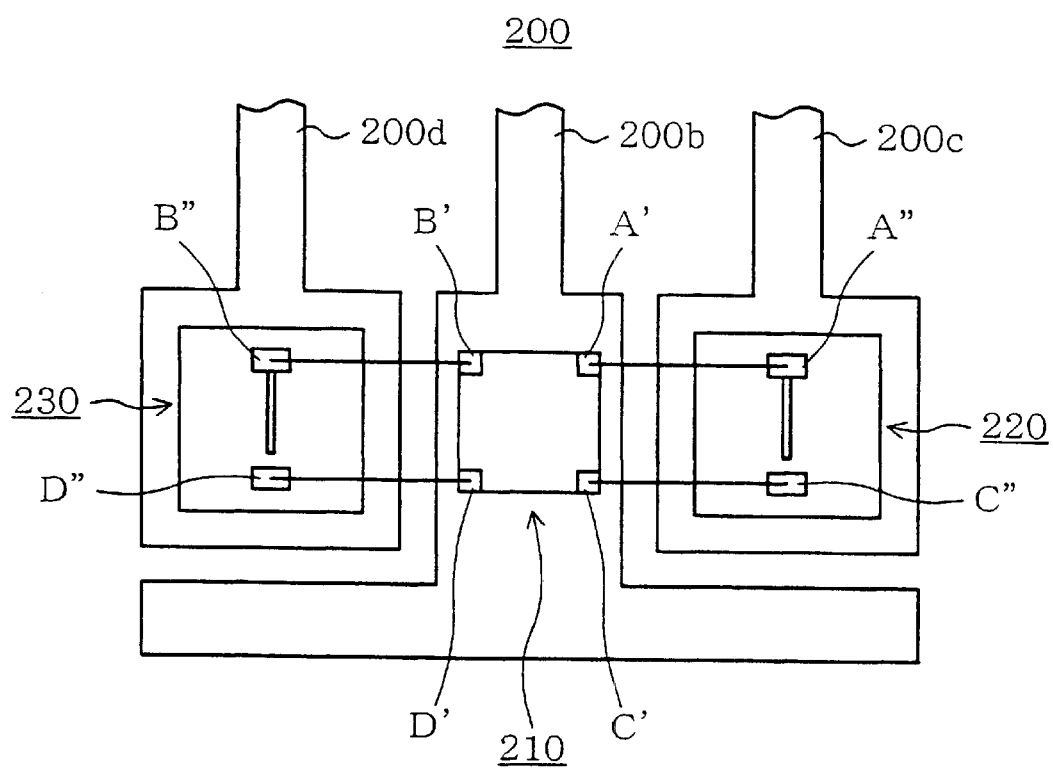
FIG. 3 shows a wire-bonding layout of a light receiver chip in the photocoupler, shown in FIG. 2.
Figure 4:
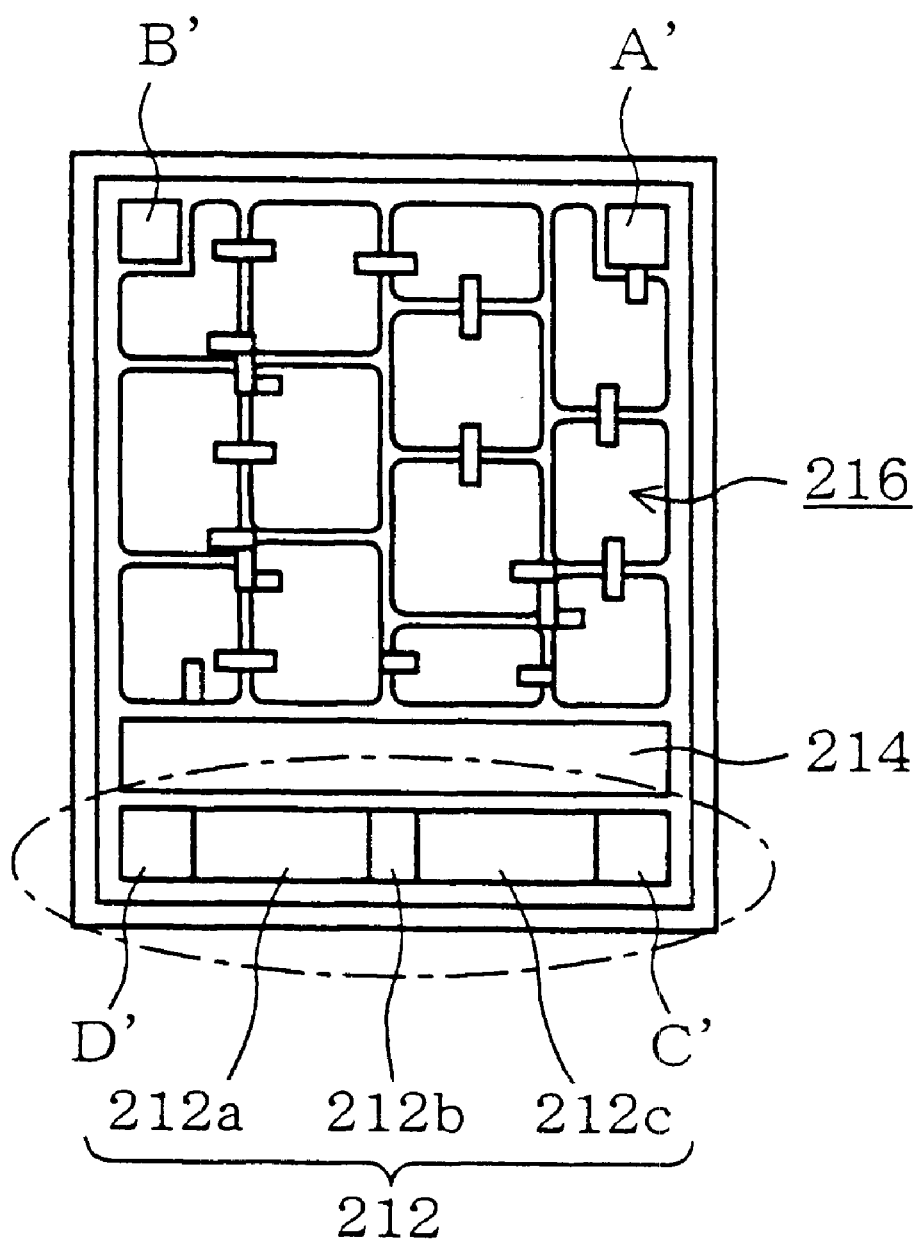
FIG. 4 is a plan view showing the light receiver chip, shown in FIG. 3.

A first preferred embodiment of the present invention is described in conjunction with FIGS. 2–4. FIG. 2 is a cross-sectional view showing a photocoupler 200. FIG. 3 is a plan view showing a wire bonding layout of a light receiver (photo detector) chip 210. FIG. 4 is a plan view showing the light receiver chip 210.

As shown in FIG. 2, the photocoupler 200 includes a light-emitting chip 204, formed on a first lead frame 200a; and the light receiver chip 210, formed on a second lead frame 200b. The light-emitting chip 204 includes a circuit corresponding to the light-emitting unit 120, shown in FIG. 1. The light receiver chip 210 includes circuits corresponding to the light receiver 152, discharge control circuit 160 and first and second fuses 130 and 140, shown in FIG. 1.

A light-emitting area of the light-emitting chip 204 and a light receiving area of the light receiver chip 210 are arranged to face or oppose to each other through a transparent resin 201. The light-emitting chip 204, transparent resin 201 and light receiver chip 210 are sealed with a mold resin 202.

As shown in FIG. 3, the photocoupler 200 includes a first output chip 220 provided on a third lead frame 200c; and a second output chip 230 provided on a fourth lead frame 200d. The first output chip 220 includes a VDMOS (Vertical Diffusion MOSFET), which corresponds to the first MOSFET 154, shown in FIG. 1. The second output chip 230 includes a VDMOS, which corresponds to the second MOSFET 156, shown in FIG. 1. The third lead frame 200c has a function corresponding to the first terminal 110, shown in FIG. 1. The fourth lead frame 200d has a function corresponding to the second terminal 112, shown in FIG. 1. The first and second output chips 220 and 230 are arranged symmetrically each other relative to the light receiver chip 210.

A connecting pad A' on the light receiver chip 210 and a connecting pad A" on the first output chip 220 are connected by a bonding wire. A connecting pad B' on the light receiver chip 210 and a connecting pad B" on the second output chip 230 are connected by a bonding wire. A connecting pad C' on the light receiver chip 210 and a connecting pad C" on the first output chip 220 are connected by a bonding wire. A connecting pad D' on the light receiver chip 210 and a connecting pad D" on the second output chip 230 are connected by a bonding wire.

The connecting pads A' and A" correspond to a point A, which is arranged between the second output terminal 174 of the discharge control circuit 160 and the gate terminal of the first MOSFET 154, shown in FIG. 1. The connecting pads B' and B" correspond to a point B, which is arranged between the second output terminal 174 of the discharge control circuit 160 and the gate terminal of the second MOSFET 156, shown in FIG. 1. The connecting pads C' and C" correspond to a point C, which is arranged between the first output terminal 176 of the discharge control circuit 160 and the source terminal of the first MOSFET 154, shown in FIG. 1. The connecting pads D' and D" correspond to a point D, which is arranged between the first output terminal 176 of the discharge control circuit 160 and the source terminal of the second MOSFET 156, shown in FIG. 1.

The light receiver chip 210 is designed as shown in FIG. 4. The connecting pads A', B', C' and D' are provided on the corners of the chip 210. The connecting pads C' and D' are connected by a wiring unit 212. The wiring unit 212 includes a first resistance 212a, corresponding to the first fuse 130, shown in FIG. 1; a connecting point 212b, corresponding to the node 114a, shown in FIG. 1; and a second resistance 212c, corresponding to the second fuse 140, shown in FIG. 1. The light receiver chip 210 further includes a photodiode array 216, which corresponds to the light receiver 152, shown in FIG. 1. The light receiver chip 210 also includes a discharge control circuit 214 between the wiring unit 212 and photodiode array 216.

In the wiring unit 212, the first and second resistances 212a and 212c and connecting point 212b are made of aluminum wires. The aluminum wires are formed by forming an aluminum layer on a surface of the light receiver chip, and dry-etching the aluminum layer to shape. When over current (excess current) flows between the third lead frame 200c and fourth lead frame 200d, the first resistance 212a or second resistance 212c is melted and cut off by Joule heat.

The first and second resistances 212a and 212c correspond to sections of circuit breaker, described in the claims.

The first and second fuses 130 and 140 are not limited in design by the wiring unit 212. Semiconductor devices, such as transistors, and electric circuits are applicable to the first and second fuses 130 and 140 as long as the fuses disconnect the first path 114 in response to over current (excess current).

Second Preferred Embodiment

Figure 5:
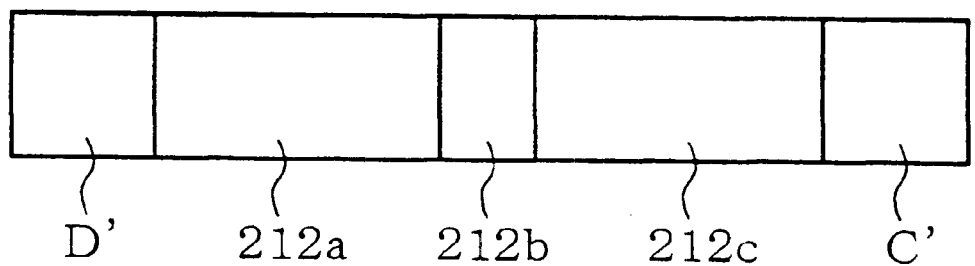
FIG. 5 shows an example of a wiring (circuit) unit in the light receiver chip, shown in FIG. 4.
Figure 5:
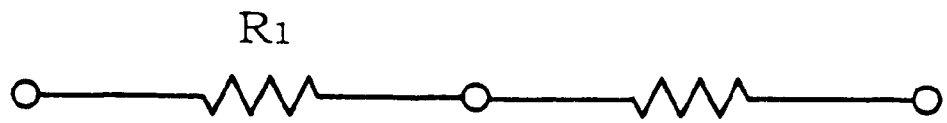
Figure 6:
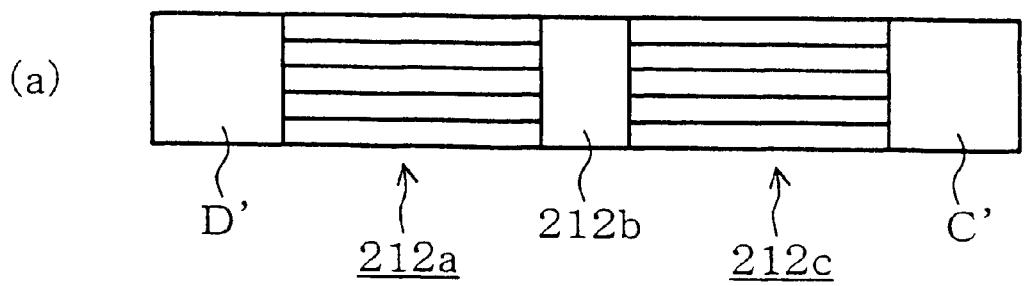
FIG. 6 shows another example of a wiring (circuit) unit in the light receiver chip, shown in FIG. 4.
Figure 6:
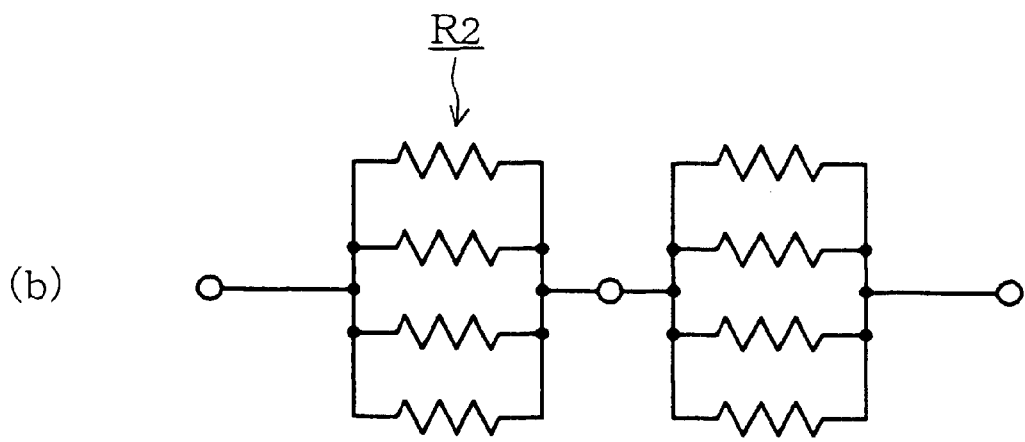
Figure 7:
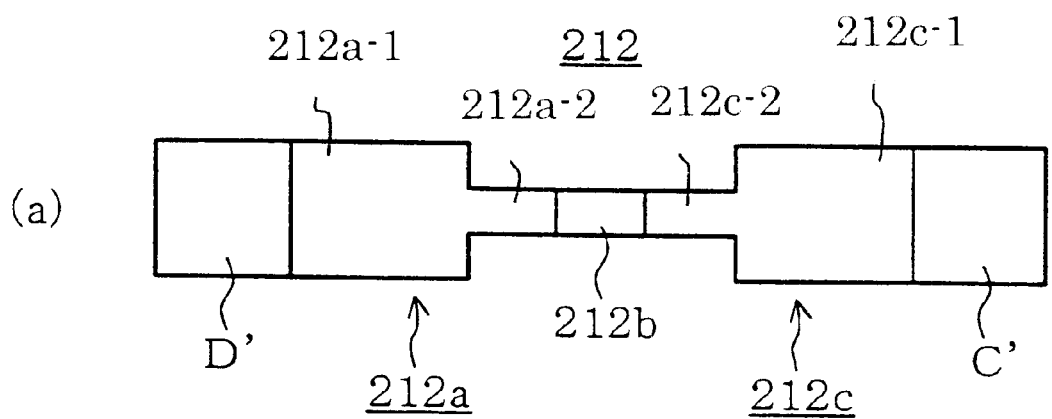
FIG. 7 shows another example of a wiring (circuit) unit in the light receiver chip, shown in FIG. 4.
Figure 7:
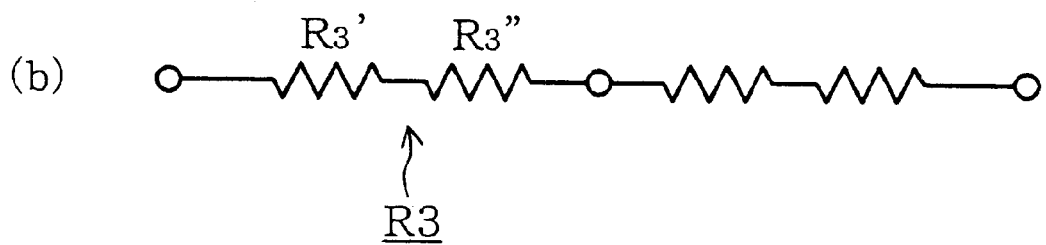

Next, a second preferred embodiment of the present invention is described in conjunction with FIGS. 5–7. This embodiment provides another type of wiring unit (212), shown in FIG. 4. In this embodiment, first and second resistances 212a and 212c are designed to have the same length L and same specific resistance (resistance rate) ρ.

FIG. 5 shows the structure of the wiring unit 212. Each of the first and second resistances 212a and 212c is a single piece of resistance. The resistance value R1 of the first resistance 212a is calculated in accordance with the following equation:

$$R1 = \rho L/W$$

FIG. 6 shows the structure of another type of wiring unit 212. Each of the first and second resistances 212a and 212c includes a plurality of resistance strips connected in parallel. The total value of resistance of the wiring unit 212 is the same as the first type, shown in FIG. 5. In FIG. 6, each of the first and second resistances 212a and 212c includes four resistance strips connected in parallel. In FIG. 6, the resistance value R2 of the first resistance 212a is calculated in accordance with the following equation:

$$R2 = 1/\{4 \times 1/(\rho L/(W/4))\} = \rho L/W$$

According to the wiring unit 212, shown in FIG. 6, surge current is dispersed to the first and second resistances 212a and 212c, so that each resistance section (resistance strip) generates a less amount of heat as compared to the embodiment, shown in FIG. 5. Each resistance strip is shaped to have a narrower width, so that the resistance strips are easily melted and cut off. When one of the resistance strips is cut off, the amount of surge current flowing through the other resistance strips is increased; and therefore the remaining resistance strips are cut off more easily step by step. The wiring unit 212 absorbs or removes damage due to surge current gradually (step by step), so that the MOSFETs (154 and 156) are not damaged easily.

FIG. 7 shows the structure of a third example of wiring unit. Each of first and second resistances 212a and 212c includes at least two sections (212a-1, 212a-2, 212c-1 and 212c-2) having different cross-section areas. The total resistance value of the wiring unit 212 is larger than the first type, shown in FIG. 5. Each of the first and second resistances 212a and 212c includes two sections (212a-1 and 212a-2/212c-1 and 212c-2) connected in series, in which the section (212a-2/212c-2) adjacent the connecting point 212b has a smaller cross-section area. The resistance section 212a-1 is formed to have a resistance value of R3' and a length of $(1-a)L$; and the resistance section 212a-2 is formed to have a resistance value of R3", a length of aL and a width of bW. The total resistance value R3 of the resistance 212a is calculated by the following equation, where 0<a<1, 0<b<1:

$$R3 = R3' + R3'' = \{\rho(1-a)L/W\} + \{\rho aL/bW\} = (\rho L/W) \cdot (1-a+a/b)$$

In the above equation, "a" and "b" meet the condition of 0<a<1 and 0<b<1, so that "1-a+a/b" becomes larger than "1". Therefore, the total resistance value of the wiring unit 212 becomes larger than that of the first example, shown in FIG. 5.

According to the wiring unit 212, shown in FIG. 7, the narrower sections 212a-2 and 212c-2 have larger resistance values as compared to the wider sections 212a-1 and 212c-1. Almost the same amount of surge current flows through the wiring unit 212 as the first example, shown in FIG. 5. More amount of heat is generated in the wiring unit 212 as compared to the first example, shown in FIG. 5, so that the narrower sections 212a-2 and 212c-2 are easily melted and cut off. Further, according to this third example of the wiring unit 212, it becomes shorter period of time to melt and cut off the unit 212 as compared to the first and second examples of wiring units, shown in FIGS. 5 and 6; and therefore, the damage applied to the MOSFETs 154 and 156 is decreased.

Third Preferred Embodiment

A third preferred embodiment is made for systems using the above described photocoupler according to the present invention.

Figure 8:
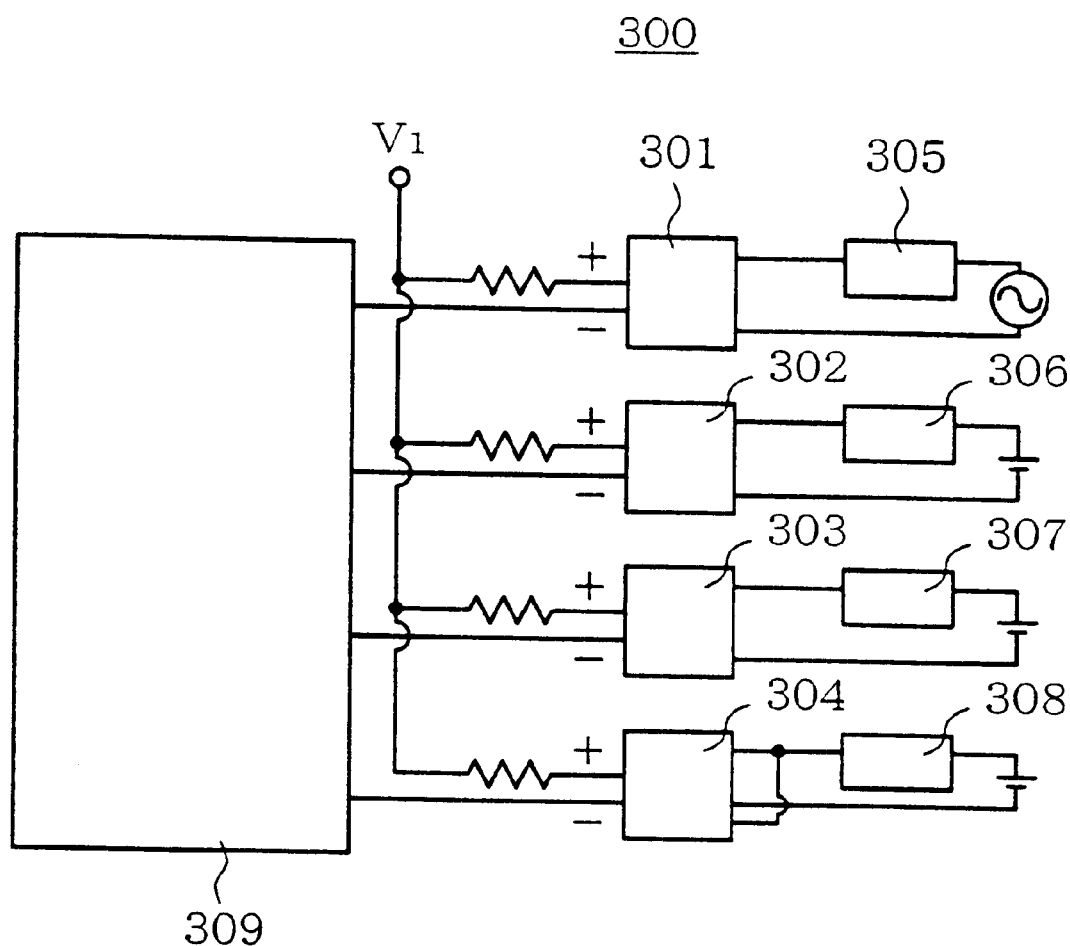
FIG. 8 is a block diagram showing a controller system according to the present invention.

FIG. 8 shows the structure of a controller system 300, which includes photocouplers 301–304 according to the present invention. The controller system 300 further includes a controller unit 309 whose output terminals are connected to minus input terminals of the photocouplers 301–304. The photocouplers 301–304 are applied at the other input terminals with supply voltage V1 of about 5V. The photocoupler 301 is connected at an output terminal to an AC motor 305, and at the other output terminal to a DC power supply. The photocoupler 302 is connected at an output terminal to a DC motor 306. The DC motor 306 is connected at the output terminal to a MOSFET, of which a source terminal is connected to a DC power supply. The photocoupler 303 is connected at an output terminal to an LED 307. The LED 307 is connected at the output terminal to a MOSFET, of which a source terminal is connected to a DC power supply. The photocoupler 304 is connected at the two output terminals to a large current load 308, of which a MOSFET is connected at a source terminal to a DC power supply.

Next, the operation of the controller system 300, shown in FIG. 8, is described. When the controller unit 309 supplies control signals to the light emitting units of some of the photocouplers 301–304, the photocouplers turn on. When the photocoupler (301, 302, 303 or 304) turns on, the corresponding load (305, 306, 307 or 308) is driven. If over current (excess current) flows through the photocouplers due to for example thunderbolt (lightning), the photocouplers 301–304 keep being opened. Therefore, even if the photocouplers 301–304 become out of order in response to over current (excess current), the loads 305–308 would be prevented from being seriously damaged.

Figure 9:
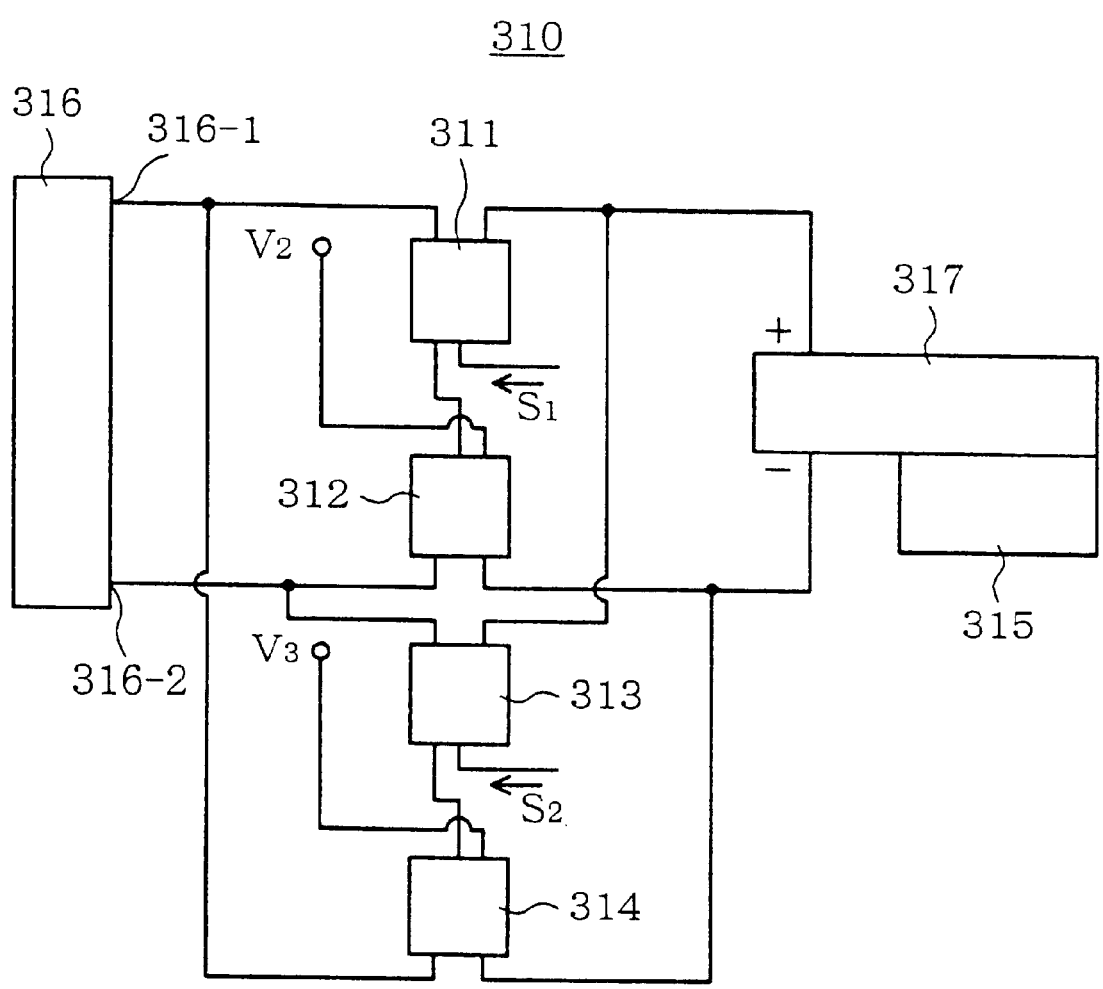
FIG. 9 is a block diagram showing a power supply system according to the present invention.

FIG. 9 shows the structure of a power supply system 310, which includes photocoupler 311–314 according to the present invention. A power supply unit 317 is connected at a plus terminal to output terminals of the photocouplers 311 and 313; and at a minus terminal to output terminals of the photocouplers 312 and 314. An output unit 316 includes an output terminal 316-1, connected to the other output terminals of the photocouplers 311 and 314. The output unit 316 includes another output terminal 316-2, connected to the other output terminals of the photocouplers 312 and 313. The photocoupler 311 is connected at an input terminal with an input terminal of the photocoupler 312. The photocoupler 313 is connected at an input terminal with an input terminal of the photocoupler 314. The photocoupler 311 is supplied at another input terminal with a switching signal S1, in response to which the photocoupler 311 operates. The photocoupler 312 is supplied with a power supply voltage V2, such as of 5V. The photocoupler 313 is supplied at another input terminal with a switching signal S2, in response to which the photocoupler 312 emits light. The photocoupler 314 is supplied with a power supply voltage V3, such as of 5V. The power supply unit 317 is controlled by a controller 315.

Next, the operation of the power supply system 310 is described. In response to the switching signal S1 and S2, one pair of the photocouplers (311 and 312) or (313 and 314) turn on. When such a pair of photocouplers turn on, load current flows through the plus terminal and minus terminal of the power supply unit 317, and output terminals 316-1 and 316-2 of the output unit 316. As a result, the polarity of each of the output terminals 316-1 and 316-2 is set or determined. If over current (excess current) flows through the photocouplers 311–314, the photocouplers 311–314 keep being opened. Therefore, even if the photocouplers 311–314 become out of order in response to over current (excess current), the output unit 316 and power supply unit 317 would be prevented from being seriously damaged.

Figure 10:
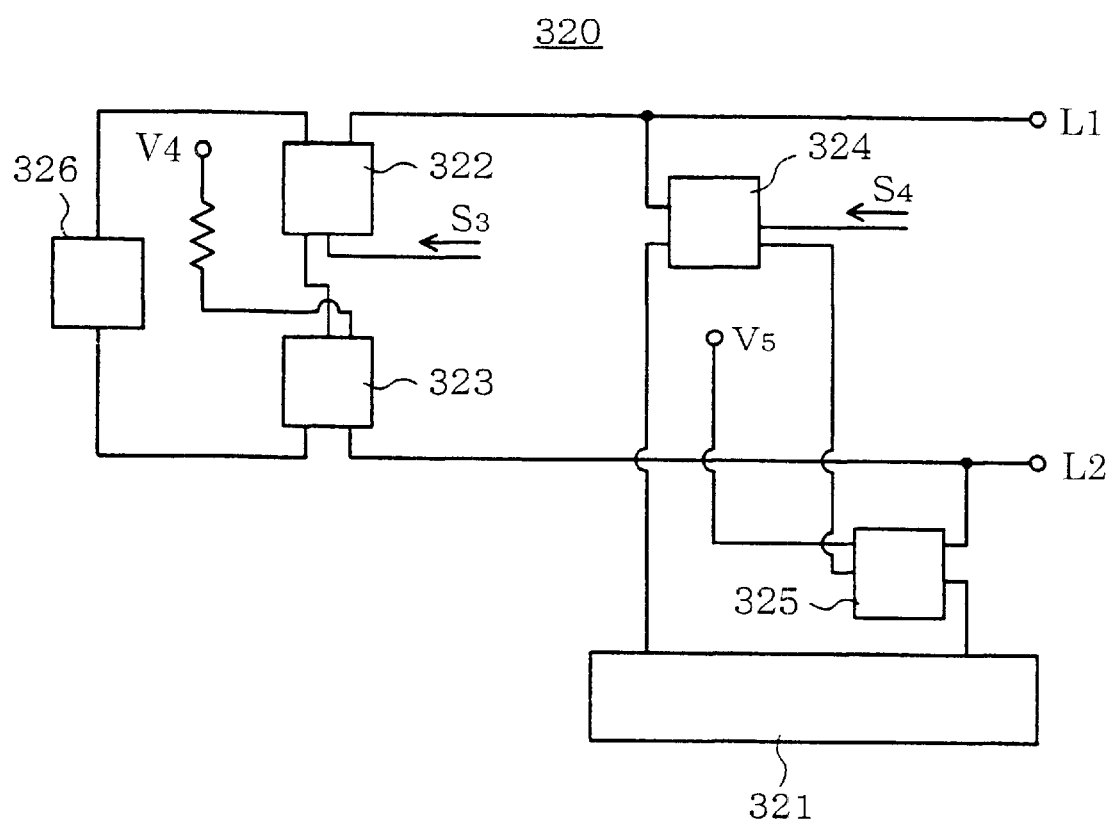
FIG. 10 is a block diagram showing a terminal switching system according to the present invention.

FIG. 10 shows the structure of a terminal switching system 320, which includes photocoupler 322–325 according to the present invention. A telephone set (terminal device) 326 is connected to output terminals of the photocouplers 322 and 323. A facsimile machine (terminal device) 321 is connected to output terminals of the photocouplers 324 and 325. The photocouplers 322 and 324 are connected at the other output terminals to a metallic line L1. The photocouplers 323 and 325 are connected at the other output terminals to a metallic line L2. An input terminal of a light-emitting unit of the photocoupler 322 is connected with an input terminal of a light-emitting unit of the photocoupler 323. An input terminal of a light-emitting unit of the photocoupler 324 is connected with an input terminal of a light-emitting unit of the photocoupler 325. The photocoupler 322 is supplied at the other input terminal with a switching signal S3. The photocoupler 323 is applied at the other input terminal with a supply voltage V4, such as of 5V. The photocoupler 324 is supplied at the other input terminal with a switching signal S4. The photocoupler 325 is applied at the other input terminal with a supply voltage V5, such as of 5V.

Next, the operation of the terminal switching system 320 is described. In response to the switching signal S3 or S4, one pair of photocouplers 322 and 323 or 324 and 325 turn on. As a result, the telephone set 326 or facsimile machine 321 is connected to the metallic lines L1 and L2. If over current (excess current) flows through the photocouplers 322–325 due to for example thunderbolt or lightning, the photocouplers 322–325 keep open condition. Therefore, even if the photocouplers 322–325 become out of order in response to over current (excess current), the metallic lines L1 and L2 would be prevented from being seriously damaged; and therefore no trouble is made in the communication.

In the above-described embodiments, MOSFETs are used as switching terminals for the photocouplers; however, other power devices can be used. For example, photodiode, phototransistor, photo-Darlington and photo-thyristor are applicable to a photocoupler of the present invention.

As described above, according to the present invention, a photocoupler includes a switching device, which mainly controls the flow of current; and a circuit breaker, which protects the switching device from abnormal or unusual current, such as surge current. Therefore, the photocoupler keeps open state when such over current (excess current) flows through it. Preferably, resistance (circuit breaker) is designed so that heat generated due to over current (excess current) is concentrated at a specific section of the resistance. If so, the resistance (circuit breaker) is easily melted and broken (cut off). The number of resistance, value of resistance, size, and the like may be changed for improvement. Consequently, according to the present invention, an improved photocoupler, which becomes out of order in response to over current (excess current) without damaging the whole system, is provided.

What is claimed is:

1. A photocoupler comprising:
a light emitting unit which emits light;
a first path connecting a first terminal and a second terminal;
a switching circuit provided in the first path to open and close the first path in response to the input light; and
a circuit breaker provided in the first path to disconnect the first path in response to over current (excess current) flowing through the first path such that damage to the switching circuit is prevented, wherein the circuit breaker comprises a section that is melted and cut off in response to the over current flowing through the first path.

2. A photocoupler according to claim 1, wherein the switching circuit comprises:
a photo detector, which generates an electric signal in response to the input light; and
a switching element which opens and closes the first path in response to the electric signal, supplied from the photo detector.

3. A photocoupler according to claim 2, wherein the switching element is a MOSFET (Metal Oxide Semiconductor Field Effect Transistor).

4. A photocoupler according to claim 1, wherein the switching circuit comprises at least two switching elements; and
the circuit breaker is provided between two of the switching elements.

5. A photocoupler according to claim 4, wherein the switching elements are MOSFETs.

6. A photocoupler according to claim 2, wherein the switching circuit further comprises a discharge controller provided in a second path, connecting the photo detector and switching element, to control the discharge condition of the switching element.

7. A photocoupler according to claim 6, wherein the discharge controller is driven in response to the input light.

8. A photocoupler according to claim 2, wherein the switching element is a semiconductor element that is one selected from a group composed of a photodiode, a phototransistor, a photo-Darlington and a photo-thyristor.

9. A photocoupler according to claim 1, wherein the circuit breaker comprises a section that is melted and cut off in response to over current (excess current).

10. A photocoupler according to claim 4, wherein the circuit breaker comprises a plurality of fuses which are melted and cut off in response to over current (excess current) flowing through the first path.

11. A photocoupler according to claim 10, wherein the fuses are connected in parallel in the first path.

12. A photocoupler according to claim 10, wherein the fuses are connected in series in the first path.

13. A photocoupler according to claim 12, wherein the fuses comprise a first fuse and a second fuse, in which the second fuse has a smaller cross-sectional area than the first fuse.

14. A photocoupler according to claim 1, wherein the section is an aluminum wire.

15. A photocoupler according to claim 10, wherein the fuses are of aluminum.

16. A photocoupler according to claim 1, wherein the photocoupler comprises at least two of the circuit breaker provided in series in the first path.

17. A photocoupler, comprising:

a light emitting unit which emits input light;

a first path connecting a first terminal and a second terminal;

a pair of MOSFETs provided in the first path to open and close the first path in response to the input light; and a plurality of circuit breakers which are serially connected between the MOSFETs to disconnect the first path in response to over current (excess current) flowing through the first path, wherein the circuit breakers comprise fuses which are melted and cut off in response to over current flowing through the first path such the damage to the MOSFETs is prevented.

18. A controller system, comprising:

at least one current load, said at least one current load being one of an AC motor, a DC motor and a LED;

a control circuit which controls the at least one current load; and a photocoupler comprising a light emitting unit which emits light, a first path connecting a first terminal and a second terminal, a switching circuit provided in the first path to open and close the first path in response to the input light, and a circuit breaker provided in the first path to disconnect the first path in response to over current (excess current) flowing through the first path such that damage to the switching circuit is prevented, wherein the circuit breaker comprises a section that is melted and cut off in response to the over current flowing through the first path, and wherein said photocoupler couples the control circuit and the at least one current load.

19. A power supply system, comprising:

a power supply unit which supplies electric power;

an output unit which outputs the electric power supplied from the power supply unit; and a photocoupler comprising a light emitting unit which emits light, a first path connecting a first terminal and a second terminal, a switching circuit provided in the first path to open and close the first path in response to the input light, and a circuit breaker provided in the first path to disconnect the first path in response to over current (excess current) flowing through the first path such that damage to the switching circuit is prevented, wherein the circuit breaker comprises a section that is melted and cut off in response to the over current flowing through the first path, and wherein said photocoupler couples the power supply unit and the output unit.

20. A terminal switching system, comprising:

a communication line;

a plurality of communication terminals to be connected to the communication line;

a photocoupler comprising a light emitting unit which emits light, a first path connecting a first terminal and a second terminal, a switching circuit provided in the first path to open and close the first path in response to the input light, and a circuit breaker provided in the first path to disconnect the first path in response to over current (excess current) flowing through the first path such that damage to the switching circuit is prevented, wherein the circuit breaker comprises a section that is melted and cut off in response to the over current flowing through the first path, and wherein said photocoupler couples the communication terminals and the communication line.

21. A terminal switching system according to claim 20, wherein the communication terminals comprise at least one of a telephone set and a facsimile machine, and the communication line is a telephone line.

* * * * *